(12) United States Patent
Vu et al.

(10) Patent No.: US 6,374,859 B1
(45) Date of Patent: Apr. 23, 2002

(54) MANIFOLD SYSTEM FOR ENABLING A DISTRIBUTION OF FLUIDS

(75) Inventors: Kim N. Vu, Yorba Linda; Eric J. Redemann, Laguna Niguel; David P. Sheriff, Anaheim Hills, all of CA (US)

(73) Assignee: Unit Instruments, Inc., Yorba Linda, CA (US)

( * ) Notice: Subject to any disclaimer, the term of this patent is extended or adjusted under 35 U.S.C. 154(b) by 0 days.

(21) Appl. No.: 09/111,999

(22) Filed: Jul. 8, 1998

Related U.S. Application Data

(63) Continuation of application No. 08/960,464, filed on Oct. 29, 1997, which is a continuation-in-part of application No. 08/739,936, filed on Oct. 30, 1996.

(51) Int. Cl.[7] ............................................... F16K 27/00
(52) U.S. Cl. ........................................ 137/884; 251/367
(58) Field of Search ................................. 137/884, 269, 137/271, 597; 251/367; 285/125.1, 124.1, 124.3, 124.5

(56) References Cited

U.S. PATENT DOCUMENTS

| | | | |
|---|---|---|---|
| 3,025,878 A | 3/1962 | Hupp | |
| 3,384,115 A | 5/1968 | Drazan et al. | |
| 3,476,214 A | * 11/1969 | Callahan | ..................... 137/271 |
| 3,915,194 A | * 10/1975 | Friedrich | ................. 251/367 X |
| 3,934,605 A | * 1/1976 | Legris | ..................... 137/884 X |
| 3,993,091 A | * 11/1976 | Loveless | ................. 137/271 X |
| 4,080,752 A | 3/1978 | Burge | |
| 4,093,329 A | 6/1978 | Asbill, III | |

(List continued on next page.)

FOREIGN PATENT DOCUMENTS

| | | |
|---|---|---|
| EP | 751301 | 6/1996 |
| EP | 754896 | 7/1996 |
| EP | 0 845 623 A1 | 6/1998 |
| FR | 2 250 907 | 6/1975 |
| FR | 2307151 | * 11/1976 ................. 137/884 |
| JP | 4-35835 | 6/1992 |
| JP | 7-58721 | 3/1995 |
| JP | 7-78128 | 3/1995 |
| JP | 7-074113 | * 3/1995 |
| JP | 8-312900 | 11/1996 |
| JP | 9-184577 | 7/1997 |
| WO | 9510001 | 4/1995 |
| WO | 9629529 | 9/1996 |
| WO | 9634705 | 11/1996 |
| WO | WO 98 25058 A | 6/1998 |
| WO | 9825058 | 6/1998 |

OTHER PUBLICATIONS

International Search Report from International Patent Application PCT/US99/15272, filed Jul. 7, 1999.

*Primary Examiner*—John Fox
*Assistant Examiner*—John Bastianelli
(74) *Attorney, Agent, or Firm*—Wolf, Greenfield & Sacks, P.C.

(57) ABSTRACT

A manifold system for incorporation in a gas panel distribution system for semi-conductor manufacturing includes a plurality of individual manifold blocks with each manifold block having a fluid passageway with an entrance and exit port accessing a common surface. Adjacent manifold blocks are removably interconnected to permit the respective fluid passageways to be in position for interconnection. A plurality of active components can be sealingly fastened to the individual manifold blocks to complete the interconnection of the respective fluid passageways. Each active component can bridge over a pair of adjacent individual manifold blocks and form with the individual manifold blocks an operative gas stick for delivering gas to a semiconductor tool. The individual manifold blocks can be identical in configuration and can include a first upper flange on one side and a second lower flange on an opposite side to enable an interlocking of adjacent manifold blocks.

3 Claims, 8 Drawing Sheets

U.S. PATENT DOCUMENTS

| | | | |
|---|---|---|---|
| 4,168,724 A | | 9/1979 | Graffunder et al. |
| 4,181,141 A | | 1/1980 | Stoll et al. |
| 4,247,133 A | * | 1/1981 | Moller .................. 137/271 X |
| 4,352,532 A | | 10/1982 | Haqrdin |
| 4,524,807 A | | 6/1985 | Toliusis |
| 4,921,072 A | | 5/1990 | Divisi |
| 5,178,191 A | | 1/1993 | Schaefer |
| 5,368,062 A | * | 11/1994 | Okmura et al. ......... 137/597 X |
| 5,460,204 A | * | 10/1995 | Rossi ..................... 137/271 X |
| 5,653,259 A | | 8/1997 | Ramstad |
| 5,662,143 A | | 9/1997 | Caughran |
| 5,749,562 A | * | 5/1998 | Moller et al. ............... 251/367 |
| 5,769,110 A | * | 6/1998 | Ohmi et al. ............ 137/271 X |
| 5,860,676 A | | 1/1999 | Brzezicki .................... 285/24 |
| 5,992,463 A | | 11/1999 | Redemann et al. |

\* cited by examiner

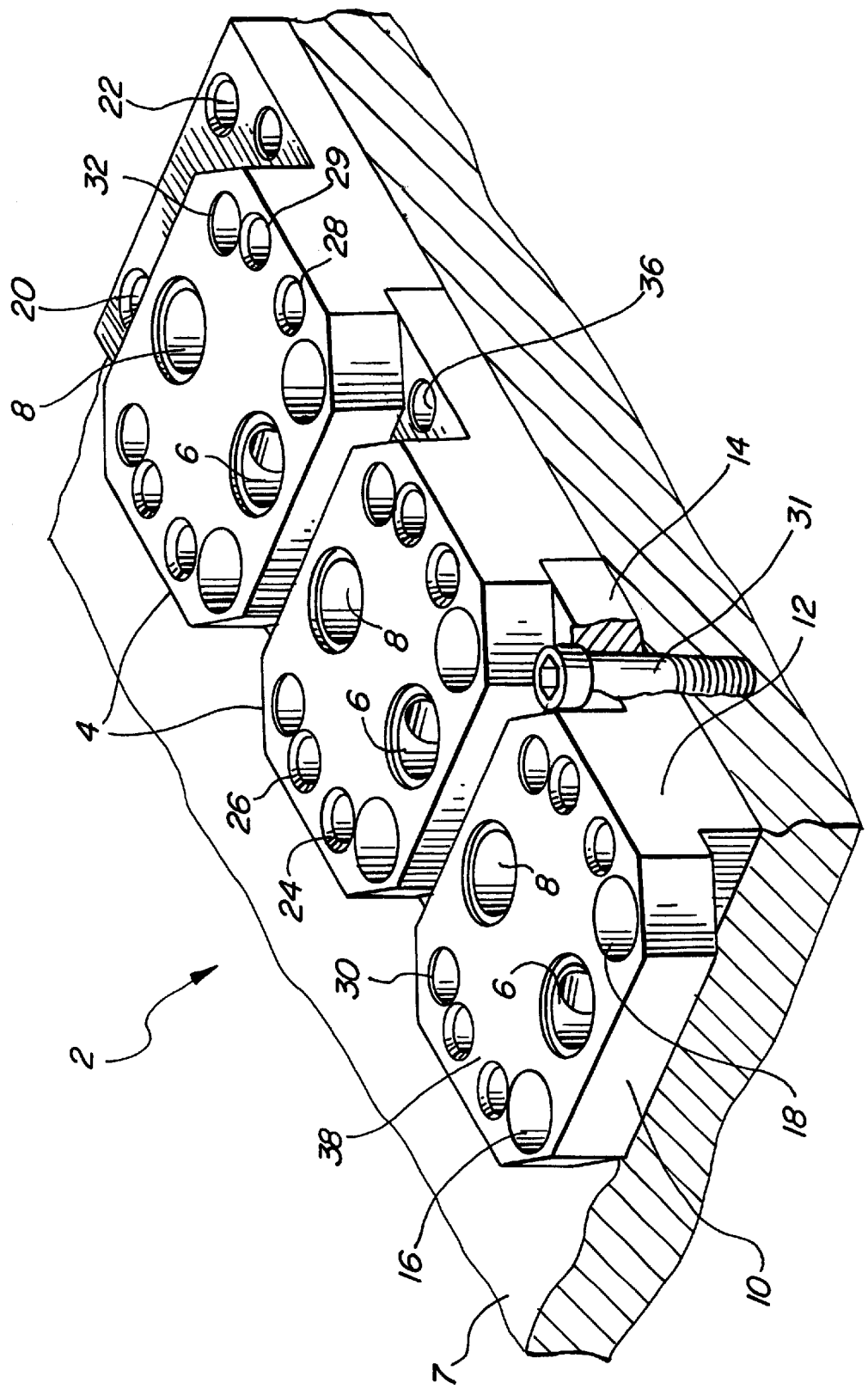
FIG. I

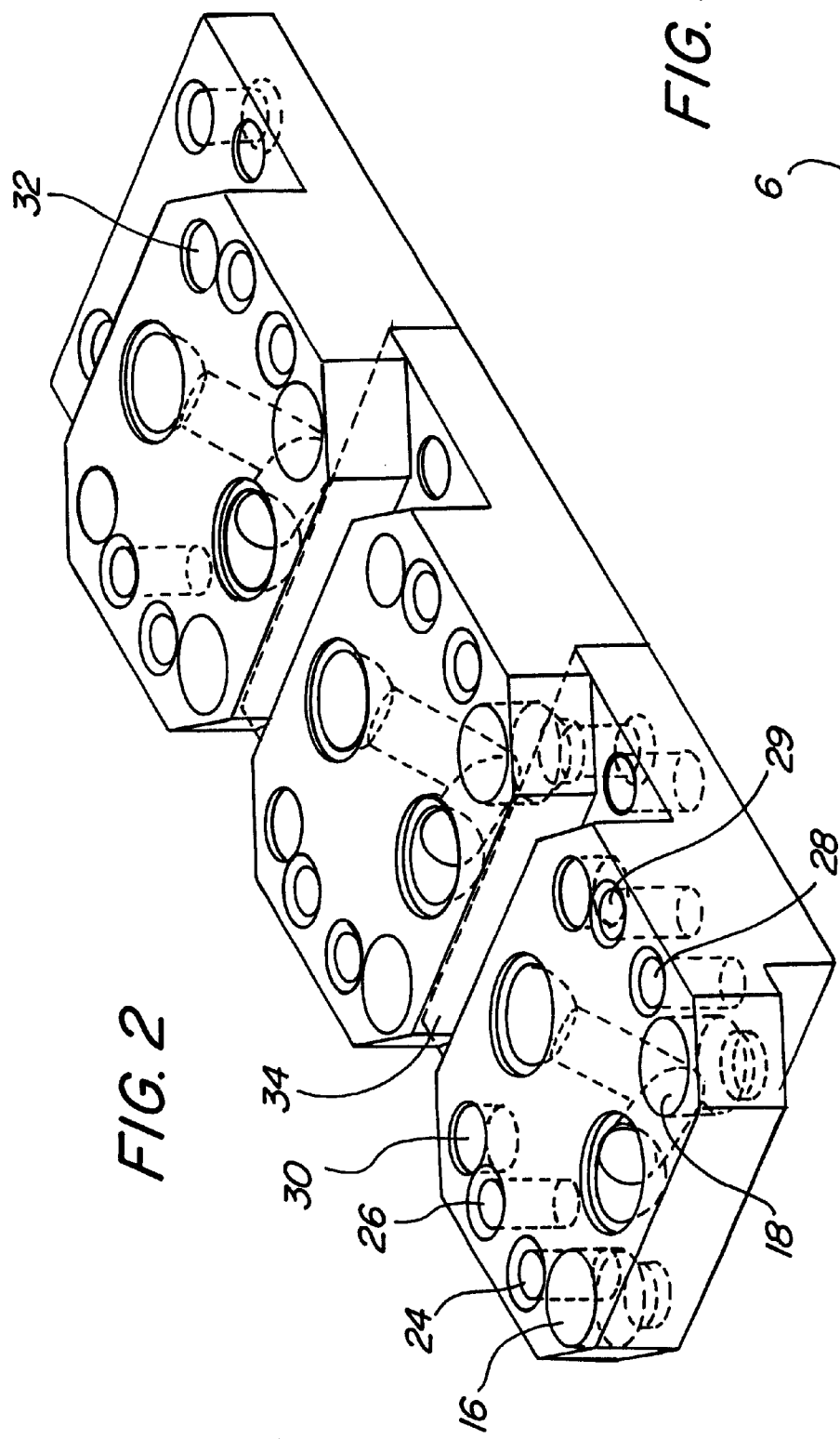

MANIFOLD SYSTEM FOR ENABLING A DISTRIBUTION OF FLUIDS

This application is a continuation of §120 to U.S. patent application Ser. No. 08/960,464, filed Oct. 29, 1997 entitled GAS PANEL, which is a continuation-in-part of U.S. patent application Ser. No. 08/739,936, filed Oct. 30, 1996 entitled GAS PANEL.

BACKGROUND OF THE INVENTION

1. Field of the Invention

The present invention is directed to a manifold system for enabling a distribution of fluids and more particularly, to a modular manifold system that is subjectively adaptable to semi-conductor processing equipment to enable a distribution of gases in a semi-conductor manufacturing environment.

2. Description of Related Art

Wafer fabrication facilities are commonly organized to include areas in which chemical vapor deposition, plasma deposition, plasma etching, sputtering and alike are carried out. In order to carry out these processes, it is necessary for the tools and machines that are used for the processes to be provided with a precise amount of processing gases to enable the fabrication steps. These gases can be inert, reactive, or can provide reactive species as desired by the particular manufacturing process.

For instance, in order to perform epitaxial deposition, silicon tetrachloride has bubbled through it a carrier gas such as dry nitrogen, which then carries silicon tetrachloride vapor into an epitaxial deposition chamber. In order to deposit a silicon oxide dielectric coating, also known as a deposited oxide coating, silane ($SiH_4$) is flowed into the tool and oxygen is flowed into the tool where they react to form ($SiO_2$) on the surface of the wafer. Plasma etching is carried out by supplying carbon tetrachloride and sulfur hexafluoride to a plasma etcher tool. The compounds are ionized, to form reactive halogen species which then etch the silicon wafer. Silicon nitride may be deposited by the reaction of dichliorosilane and ammonia in a tool. It may be appreciated that in each instance pure carrier gases or reactant gases must be supplied to the tool in contaminant-free, precisely metered quantities.

In a typical wafer fabrication facility, the inert and reactant gases are stored in tanks which may be located in the basement of the facility and which are connected via piping or conduit to a valve manifold box. The tanks and the valve manifold box are considered to be part of the facility level system. At the tool level, an overall tool system, such as a plasma etcher or the like, includes a gas panel and the tool itself. The gas panel contained in the tool includes a plurality of gas paths having connected therein active components such as manual valves, pneumatic valves, pressure regulators, pressure transducers, mass flow controllers, filters, purifiers and the like. All have the purpose of delivering precisely metered amounts of pure inert or reactant gas from the valve manifold box to the tool itself.

The gas panel is located in the cabinet with the tool and typically occupies a relatively large amount of space, as each of the active devices are plumbed into the gas panel, either through welding tubing to the devices or combinations of welds and connectors such as VCR connectors available from Cajon Corporation or the like.

Gas panels are relatively difficult to manufacture and hence expensive. In a combination VCR connector and welded tubing system, the individual components are held on shimmed supports to provide alignment prior to connections at VCR fittings. Misalignment at a VCR fitting can result in leakage.

In addition, it has been found that VCR fittings often tend to come loose in transit and some gas panel manufacturers assume that the VCR fittings have loosened during transit, possibly admitting contaminants to the system.

Welds are relatively expense to make in such systems but are typically carried out using a tungsten inert gas (TIG) system, having an orbital welding head to weld a tube stub and a tube together. The welding must take place in an inert atmosphere, such as argon, and even then leads to deterioration of the surface finish within the tubes. One of the important characteristics of modern-day gas panel systems and gas handling systems is that the surfaces of the gas handling equipment that tend to have the gas or vapor contact them must be made as smooth and nonreactive as possible in order to reduce the number of nucleation sites and collection sites where contaminants may tend to deposit in the tube, leading to the formation of particulates or dust which could contaminate the wafers being processed.

Additional problems with conventional gas panels relate to the fact that a combination VCR and welded system of the type currently used today typically requires a significant amount of space between each of the components so that during servicing the VCR connections can be accessed and opened. In addition, in order to remove an active component from a contemporary gas panel, many of the supports of the surrounding components must be loosened so that the components can be spread out to allow removal of the active component under consideration.

Most wafer fabricators are aware that it is only a matter of time until, for instance, the silane lines in the gas panels are "dusted." "Dusting" occurs when air leaks into an active silane line causing a pyrophoric reaction to take place yielding loose particulate silicon dioxide in the tube, thereby contaminating the line. Other lines also can be contaminated. For instance, those which carry chlorine gas used in etchers or which carry hydrogen chloride used in other reactions. Hydrogen chloride mixing with moisture present in the humidity of air produces hydrochloric acid which etches the interior of the tube, roughening it and increasing the number of nucleation sites and the likelihood that unwanted deposits would occur inside the tube. In both of these cases, as well as in others, it would be necessary then to open the particular line in the gas panel in order to clean it. In addition, individual component failures may require a line being opened in order to clean it and is time consuming and expensive.

Examples of fluid distribution systems can be found in not only the semi-conductor field but in other fields such as biochemical-related industries. U.S. Pat. No. 5,653,259 discloses the use of a particular form of manifold block and valving system with a saw tooth design of a common fluid passageway. U.S. Pat. No. 4,168,724 discloses a manifold block having a common conduit line that can be connected to appropriate valve members.

U.S. Pat. No. 3,384,115 discloses the mounting of pneumatic logic systems on a common manifold block. U.S. Pat. No. 4,181,141 discloses a pneumatic control circuit that permits a sequential connection of modules by the use of cylindrical connector plugs.

U.S. Pat. No. 4,352,532 discloses a manifold system that can detachably carry a plurality of pneumatically and electrically operated control units. Likewise, U.S. Pat. No.

4,093,329 discloses a manifold assembly with a plurality of property control units. U.S. Pat. No. 3,025,878, U.S. Pat. No. 4,921,072 and PCT publication No. WO 95/10001 are cited of general interest.

The prior art is still seeking to optimize the delivery of fluids such as gas to semi-conductor manufacturing equipment and it is desirable to provide surface mount gas delivery systems that will permit standardized component interfaces thereby obtaining an economy of scale.

OBJECTS AND SUMMARY OF THE INVENTION

The present invention is designed to provide a manifold system for enabling the distribution of fluids such as semi-conductor gases and to provide an improved surface mount gas delivery system that will enable a standardization of the interface of active components. With standardized component interfaces, the production, distribution, and factory and field inventories of gas delivery components can be minimized and it will be possible to have an economy of scale while still permitting a subjective design to meet the demands of the customer.

The present invention provides a solution to the problems in the prior art by providing a plurality of individual manifold blocks with each manifold block having a fluid passageway with an entrance and exit port accessing a common surface. The common surface can mount standardize active components such as mass flow controllers, pressure and flow measurement sensors, pressure regulators, gas dryers, filters, purifiers, valves, etc. with the common surface for each of the respective adjacent manifold blocks being maintained in a common plane to facilitate sealing requirements. The active components will bridge or extend across adjacent manifold blocks with the manifold blocks being removably interlocked to operatively permit the respective fluid passageways to be positioned for a sealing interconnection. The manifold blocks can be identical in configuration to ensure uniformity and precise production control of mounting surfaces.

In a first embodiment of the manifold block, a central body portion can support a first upper flange and a second lower flange with complimentary configurations that are cantilevered from the central body portion. The size and position of the first upper flange and the second lower flange are such to compliment each other so that when they are interconnected by appropriate securement holes extending through the respective flanges, the common surface for their entrance and exit ports will be held in a common plane thereby ensuring an ease in sealing the passageway. One of the ports will extend onto the upper flange and into the central body of the manifold block. Self-aligning bore holes can be positioned on the upper flange to match complimentary threaded bores in a lower flange of an adjacent manifold block. Accordingly, threaded screws or bolts can self align and be used to interconnect adjacent manifold blocks with a simple tool such as an Allen wrench.

In the first embodiment of the present invention, the respective upper and lower flanges serve to provide means for removably interlocking a pair of adjacent manifold blocks. As a second alternative embodiment of interlocking a pair of adjacent manifold blocks, separate connector plates can extend across or span manifold blocks to enable a modular manifold system that can be subjectively designed to meet the requirements of the particular semi-conductor application. The individual manifold blocks are preferably identical although special mounting features or additional fluid passageways can be provided for special applications.

A third embodiment of the present invention for providing an interlocking includes a thin flat plate to extend beneath a pair of adjacent manifold blocks and to lock them together with sufficient strength to ensure that the common surface is maintained within a common plane for sealing purposes.

As can be appreciated, each of the individual manifold blocks in each embodiment can be anchored to a supporting surface if desired with appropriate bore holes extending there through to facilitate a removable connection.

In the first preferred embodiment, the central body of the manifold block will be offset from adjacent manifold blocks to thereby not only accommodate an active component member such as a mass flow controller for bridging across the respective manifold blocks but to also permit exterior gas flow to facilitate leak detection.

As can be appreciated, by providing a modular composite manifold system, standardized individual manifold blocks can be used with a standardized foot print for connection to the active components at each of the respective stations of a gas panel line. Thus, the composite manifold blocks are arranged so that they receive gas, fluid or vapor at an inlet and can pass the fluid along to a plurality of internal channels that are sealed and connected to a plurality of active device receiving stations with the fluid ultimately being delivered to the semi-conductor manufacturing equipment.

The modular manifold system can be subjectively extended and will position the body of each of the active components at substantially right angles to the face of the individual manifold blocks that will be aligned along a common plane. The active components can be easily removed for repair or replacement and can be attached to the manifold blocks by a plurality of Allen-head bolts. The manifold system can be self-aligning with each of the manifold blocks being a repeatable machine component which has been pre-fabricated. There is no necessity to provide welding connections or VCR tube connections since the active devices can be directly supported on and connected to the individual manifold blocks with appropriate seals.

BRIEF DESCRIPTION OF THE DRAWINGS

The exact nature of this invention, as well as its objects and advantages, will become readily apparent upon reference to the following detailed description when considered in conjunction with the accompanying drawings, in which like reference numerals designate like parts throughout the figures thereof, and wherein:

FIG. 1 is a perspective view of a first embodiment of the present invention disclosing a plurality of manifold blocks mounted together as a composite manifold system;

FIG. 2 discloses the first embodiment with phantom lines disclosing the attachment holes and fluid passageways;

FIG. 3 is a cross-sectional view of the manifold block of the first embodiment;

DESCRIPTION OF THE PREFERRED EMBODIMENTS

Figure 4:
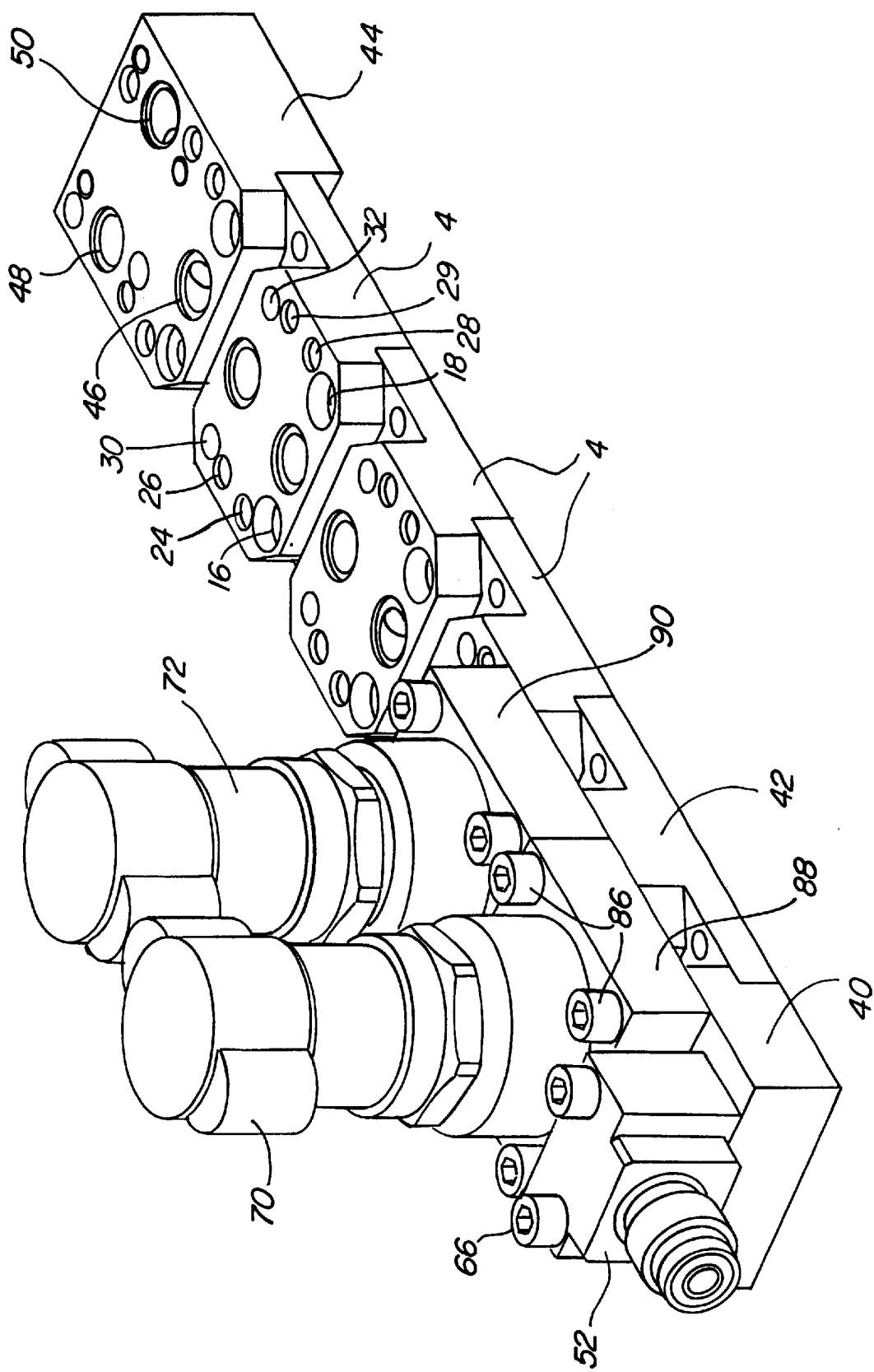
FIG. 4 is a perspective view of a gas stick arrangement of the first embodiment.

The following description is provided to enable any person skilled in the art to make and use the invention and sets forth the best modes contemplated by the inventors of carrying out their invention. Various modifications, however, will remain readily apparent to those skilled in the art, since the general principles of the present invention have been defined herein specifically to provide an improved manifold system for enabling a distribution of fluids such as gases in the semi-conductor field by utilizing modular manifold blocks that can be subjectively configured and interconnected to permit active components to be appropriately sealed for interconnection with the gas passageways.

Modern IC chip producers have improved the efficiency of their products by processing more semi-conductors on wafers of a larger diameter such as 300 mm size wafers. Such design goals have placed further demands on process tool makers to minimize any increase in the size and fabrication of equipment since workspace for the process tools is at a premium. There is also a desire to reduce the size of sub-systems and to increase their reliability to reduce down time.

Generally, a semi-conductor process tool is a self-contained unit that can handle all the operations involved in fabricating IC patterns and wafers. One of the many sub-systems is the gas delivery system. The gas delivery system is critical to IC pattern development and must deliver clean and controlled gases in a reliable and maintainable manner. While the gas delivery system takes up only 10% to 20% of a process tool's volume, any reduction in its size is beneficial since it helps offset the necessary expansion of other components such as the process chamber which must be made larger to accommodate a 300 mm wafer. Gas delivery systems based on gas sticks constructed in the form of channeled stainless steel blocks have been proposed such as U.S. patent Ser. No. 08/739,936 for a Gas Panel filed on Oct. 30, 1996 by the present assignee. This pending U.S. patent application is incorporated herein by reference.

The gas panel assembly embodying the present invention is easy to manufacture in that each of the active devices is separately aligned. If misalignment were to occur, for instance, between a pressure regulator and the device receiving station on the surface of a pair of manifold blocks, an adjacent valve mass flow controller or the like would not be positioned out of alignment with the general manifolding structure as a result thereof. Thus, any misalignment which may occur has been uncoupled from neighboring stations through the use of the present manifolding system. Tolerance stack-up problems are also avoided by the simultaneous ability of the manifold blocks to connect with and to register with the active devices.

Each of the active devices which are connect to the manifold system may be prefabricated in that they include a combination seal and screw capture mechanism component, the seal including a keeper for holding the seal in alignment with the active device and the screws being held captured by nylon split rings to hold the screws within the bores of the active device mount. This allows for quick and easy assembly. The active devices are seated upon edge seals at the active sites. The edge seals do not require extensive or fine surface preparation yet provide good, leak-free and contaminant-free joins at the gas flow inlets and outlets between the manifold system and the active devices. The seals are easily removable for replacement during repair. They include keepers for self-locating which is particularly helpful when replacing an active device on a manifold face in the field.

The inventive gas panel manifold system also allows an entire manifolding assembly, or stick to have applied thereto heated tape or other types of heaters in order to heat all of the manifold bores extending among the active device components and maintain a low vapor pressure gas or vapor in a vapor state throughout each of the process gas lines of the system.

The inventive gas panel manifolding system allows the gas panel to be easily reconfigured by a user in the field as welds and VCR connections need not be broken. An active device may be replaced or added simply by lifting it out of connection with an active device site and a new one connected thereto.

A pair of nitrogen purge inlets can be provided, both at the upstream and the downstream end of the manifold system so that should it be necessary to remove an active device from the manifold system, dry nitrogen can be blown both backward and forward through the manifold system. Dry, clean nitrogen would exit at both the exposed inlet and outlet ports of the active device site and contamination of the rest of the manifold system during the course of the changing of the active device site can be eliminated.

The advantages of the earlier work is carried forward herewith such that a 316 L stainless steel is used for the individual manifold blocks and the internal channels which are drilled in the stainless steel blocks have been passivated with chromium oxide to minimize specialty gas corrosion. The in and out ports of each component are positioned to match the manifold blocks internal v-shape channel configuration. This enables internal connections of neighboring components to complete the flow path through the gas stick and eliminates the necessity of making space for tubing and fittings. Thus, a design goal of achieving a size of gas panel that is decreased by as much as 50% from conventional welded systems is realized. The modular approach of manifold blocks still allows direct access to each component with mounting and removing of active components requiring only a manual hand tool such as but not limited to an Allen wrench. By providing direct access to active components, it is possible to make repairs simply by removing only the damaged active component thereby reducing down time. Because the manifold blocks are standardized, the design flexibility inherent in conventional welded systems is maintained since active components can be placed anywhere on this gas stick. Seals are provided in the modular system, so then in the sealing process, both the active component mounting interface and the manifold block incorporate machine glands, which comprise a malleable nickel seal or alternatively a stainless steel seal to produce a leak free system. During installation, the seal will generally produce no particulates greater than 0.1 um, and particles that may be produced can be typically purged out of the gas system in less than a minute.

Referring to FIG. 1, a first embodiment of the present invention is disclosed wherein a composite manifold assembly 2 can be mounted on an appropriate support surface by combining individual manifold blocks to form an operative system. As disclosed, each of the three manifold blocks 4 are identical and are formed from a stainless steel material such as 316L stainless steel. V-shaped gas passageways are provided in each of the manifold blocks and as shown in FIG. 1, have access ports positioned on a common upper surface 38. For ease of description, the flow path will be considered to extend from left to right although it could just as easily be reversed and, accordingly, the entrance port 6 is shown on the upper surface 38 along with an exit port 8. The entrance port 6 is partially on an upper flange member 10 which is cantilevered from a central manifold body portion 12. A lower flange member 14 is dimensioned to have a complimentary configuration to match the upper flange member 10 of the immediately adjacent manifold block. As will be subsequently described, an active component not shown in FIG. 1, will bridge across an entrance port 6 on one manifold block 4 to an exit port 8 on the adjacent manifold block 4. The upper flange member 10 is offset from the central manifold body portion 12 by a gap of approximately 0.2 inches with the distance between the center point of the respective entrance port and exit port being approximately ½ inch. This gap beneath an active component can facilitate the detection of any gas leakage as can be appreciated by a person skilled in his field. While not shown in any of the drawings of the present application, the gas stick can be mounted in a sealed housing for safety purposes and to control the purging of any leaking gases from the gas delivery system.

Referring to FIG. 2, the V-shaped gas passage between an entrance port 6 and an exit port 8 can be seen in the phantom lines. A pair of appropriate bore holes 16 and 18 on an upper flange member 10 have a lower beveled surface to enable a self-aligning of any bolt fasteners. The respective bores 16 and 18 appropriately align with threaded apertures 20 and 22 on the lower flange member 14 of an adjacent manifold block.

Figure 5:
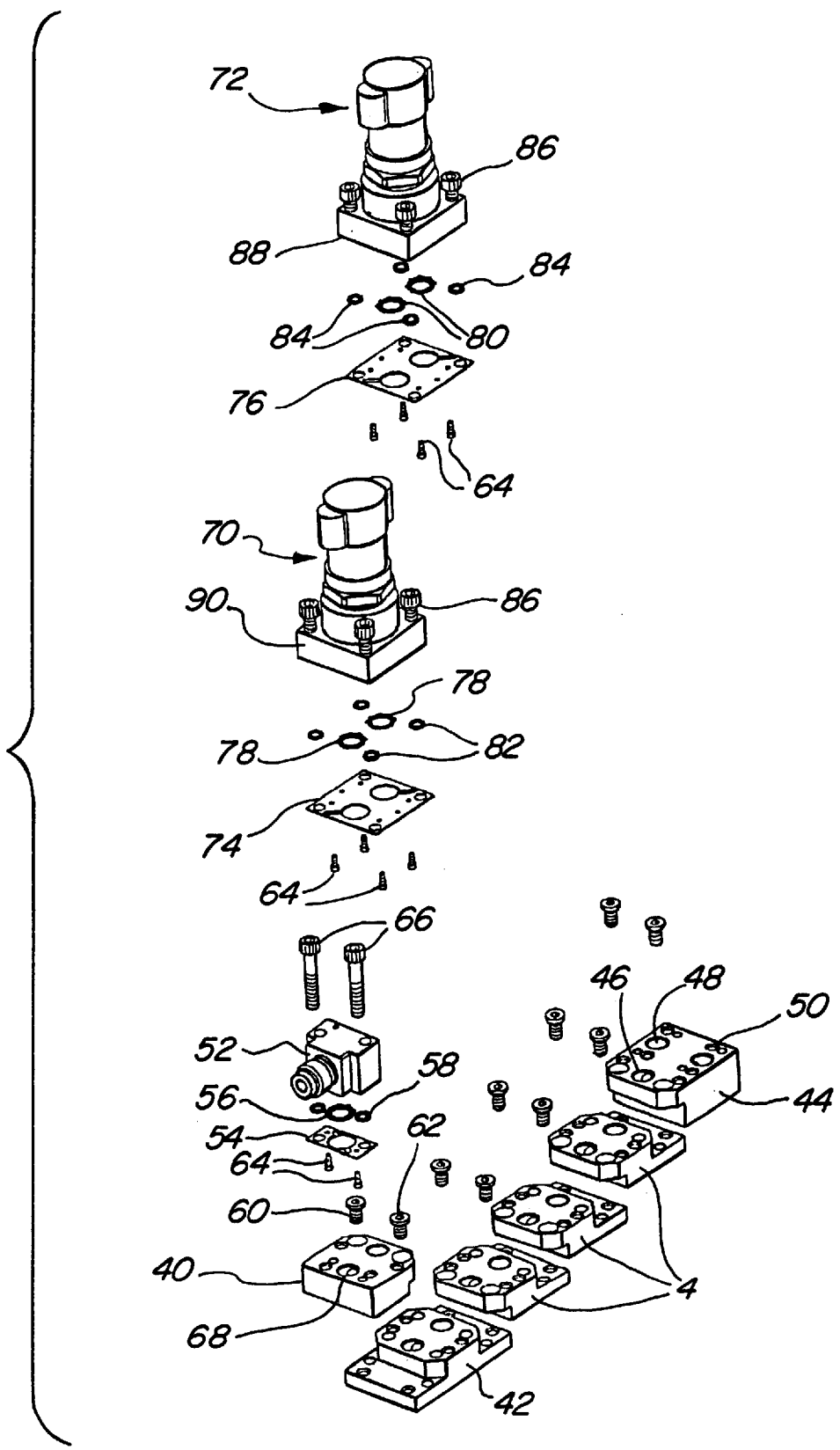
FIG. 5 is an exploded perspective view of the manifold system of the first embodiment.

A pair of threaded bores 24 and 26 and 28 and 29 are provided on each perimeter side to enable the fastening of a flange on an active component as can be seen in FIG. 4 and 5. Finally, a pair of recesses 30 and 32 on opposite sides are also provided to accommodate any protrusion of screws for fastening a keeper member to the bottom of an active component. The bore opening 16 and 18 have sufficient depth that when an appropriate fastener is sealed, there is still sufficient vertical room above a fastener to accommodate the protruding head of any fastening screw or bolt associated with the keeper member.

Again, as seen in FIGS. 1 and 2, through holes 34 and 36 are provided on either side of the lower flange members 14 to thereby accommodate a fastener 31 for attachment to a lower support surface 7. The upper flange member 10 are appropriately tapered or cut to facilitate access, for example, by an Allen wrench, to any such fasteners 31.

As can be appreciated, the first embodiment of the present invention utilizes a plurality of manifold blocks 4 having specific upper flange members 10 and lower flange members 14 that are cantilevered from a central manifold body portion 12 to enable the individual manifold blocks to be interconnected to accommodate a specific fluid distribution system. Each of the manifold blocks 4 have a fluid passageway with an entrance port 6 and an exit port 8 that access a common upper surface 38. The dimensions of the upper flange member 10 and the lower flange member 14 are such that they extend across each other and thereby provide means for removably interlocking a pair of adjacent manifold blocks 4 to operatively permit their respective fluid passageways to be positioned for interconnection.

Referring to FIG. 3, a cross-section view taken along a central longitudinal line extending from an entrance port 6 to an exit port 8 is shown for an alternative manifold block 40 that can be used as an end piece in the manifold block system. This end piece manifold block 40 can also interface with a dual lower flange manifold block 42 in the gas stick shown in FIGS. 4 and 5. As shown, a series of three identical manifold blocks 4 are stacked from the dual lower flange manifold 42 and terminate in a junction end piece 44.

The junction end piece manifold block 44 basically discloses a passageway of T-configuration wherein the entrance port 46 is fluidly connected with a pair of exit ports 48 and 50 on either side of the manifold block 44. Equivalent holes and bores are included to enable an extension of the gas stick system at right angles to the longitudinal axis of the gas stick system shown in FIG. 4.

As shown in FIG. 5, a tube coupler 52 is mounted on top of the end piece 40 manifold block with a keeper member 54 supporting an appropriate seal 56 and a pair of split ring plastic retainers 58. A pair of threaded bolts 60 and 62 can interlock the end piece manifold block 40 to the dual lower flange manifold block 42. The seal is accomplished by simply tightening the respective threaded bolts 66. Screws or fasteners 64 can hold the keeper member 54 with the seal member 56 and split ring retainers 58 in place to the bottom of the tube coupler 52. The pair of bolts 66 secure the tube coupler 52 to the surface of the end piece manifold block 40 in alignment with the entrance port 68.

A similar arrangement is provided with regards to each of the active components such as the valve assemblies 70 and 72. Appropriate keeper members 74 and 76 support seals 78 and 80 and split ring retainers 82 and 84.

Bolts 86 are used to fasten the flanges 88 and 90 on the respective active components 70 and 72 to the upper surface of the end piece manifold block 40, the dual lower flange manifold block 42 and a manifold block 4. Thus, the active component 70 is mounted immediately adjacent to the tube coupler 52 which in turn can be connected to an appropriate gas line (not shown) while the active component 72 bridges the upper surface of the dual lower flange manifold block 42 and the adjacent manifold block 4 as shown in FIG. 4.

Figure 6:
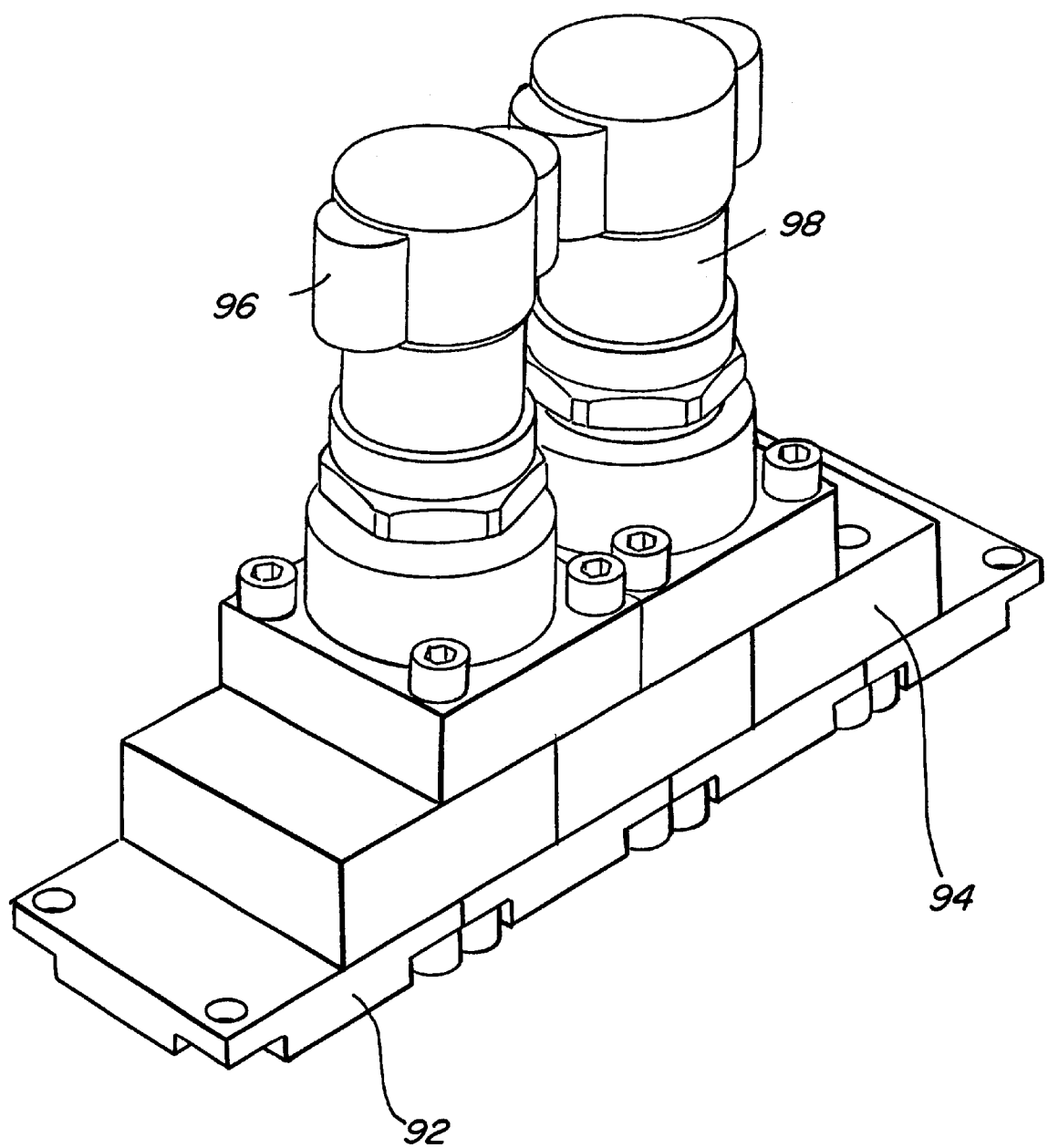
FIG. 6 is a perspective view of a second embodiment of the present invention disclosing active component parts mounted on interconnect manifold blocks that are held together with connector plates.
Figure 7:
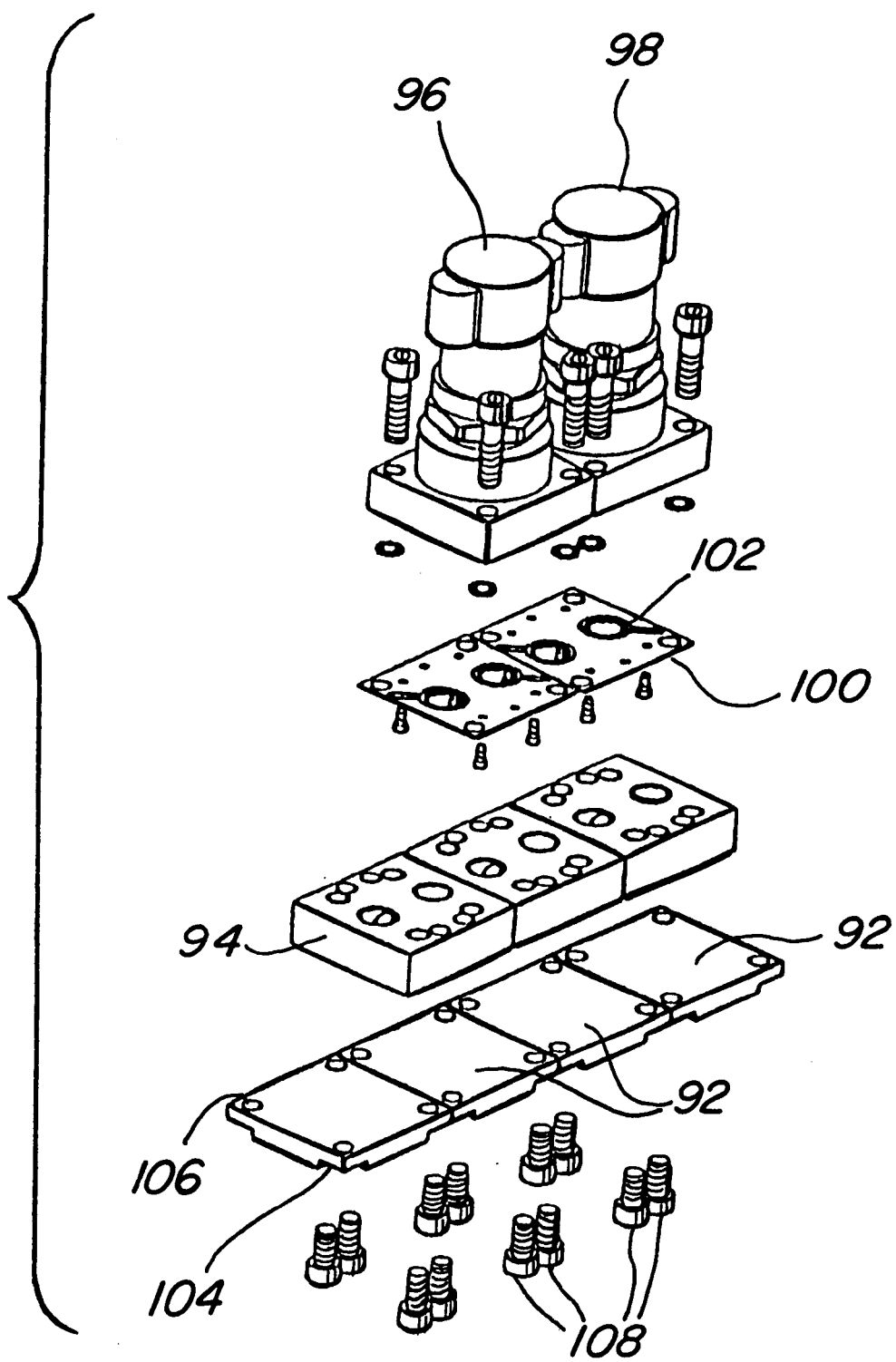
FIG. 7 is an exploded view of the second embodiment disclosed in FIG. 6.

An alternative embodiment of the present invention is shown in FIGS. 6 and 7. In this embodiment, connector plates 92 are individually provided to extend across the lower surface of individual manifold blocks 94. Again, each of the individual blocks 94 are identical and have the appropriate gas passageway and threaded bores and bore openings as described with regards to the manifold block 4. Active components 96 and 98 can be mounted on the common upper surface of the respective manifold blocks 94 within an appropriate seal keepers 100 and seals 102 as previously described with regards to the first embodiment. The corners of each of the connector plates 92 are appropriately notched or recessed 104 with an appropriate bore 106 at each of the corners. A fastener bolt 108 can extend upward for a threading engagement with a threaded bore (not shown) on the bottom of each of the manifold blocks 94. The thickness of the connector plates 92 and the vertical dimension of the notches 104 are such to permit the heads of the fasteners to be located within the notches.

In the second embodiment, the connector plates 92 can be identically manufactured and will provide sufficient strength when they bridge or cross over beneath each of the manifold blocks 94 to hold the common surfaces of the collective manifolds blocks 94 in a common plane.

Thus, in the second embodiment, the means for removably interlocking a pair of adjacent manifold blocks 94 to operatively permit their respective fluid passageways to be positioned for interconnection with an active component part is accomplished as a result of the identical connector plates 92.

Figure 8:
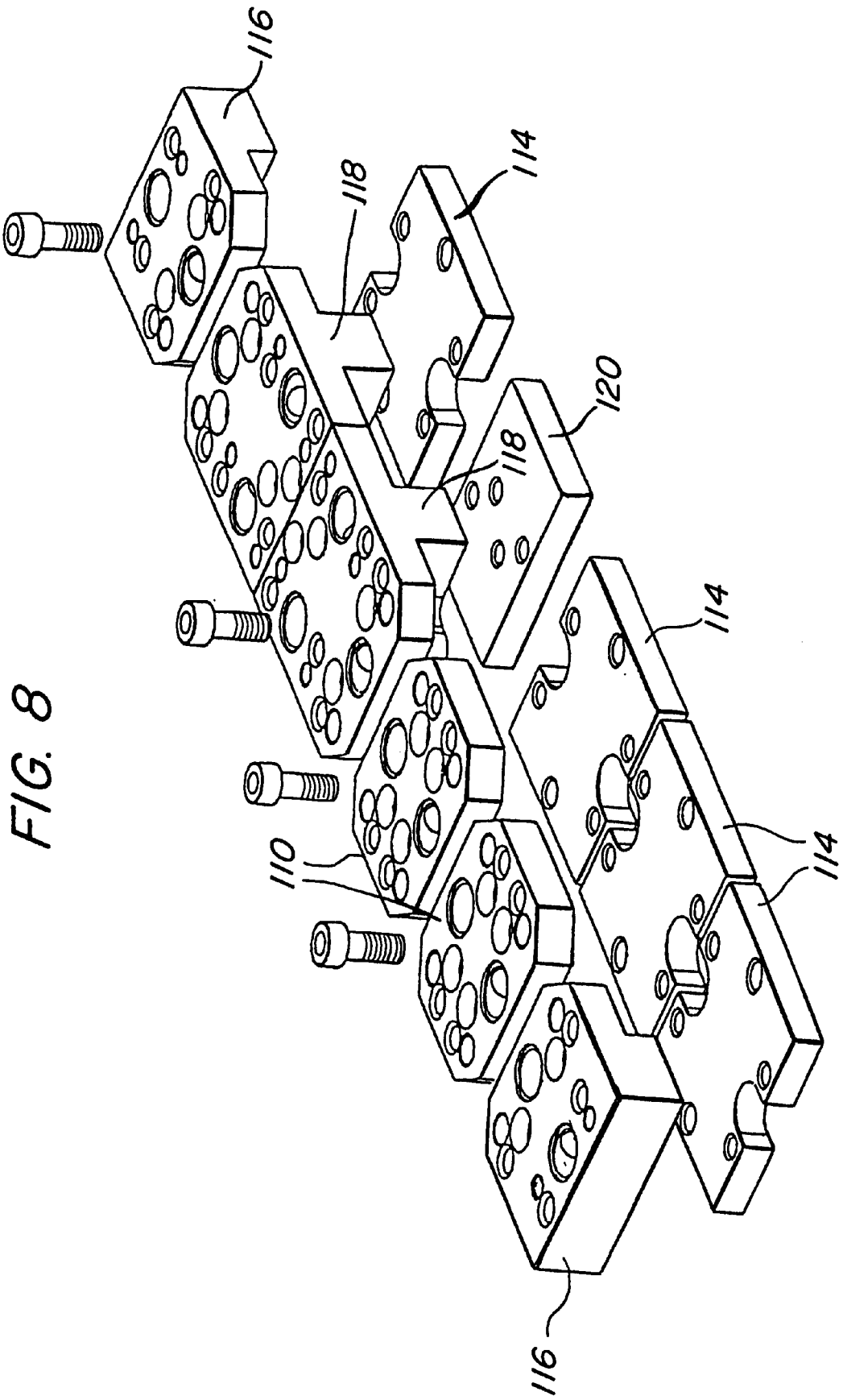
FIG. 8 is a third embodiment of the present invention disclosing an exploded view of interconnect manifold blocks of alternative configurations that can be held together by a series of connector plates.
Figure 9:
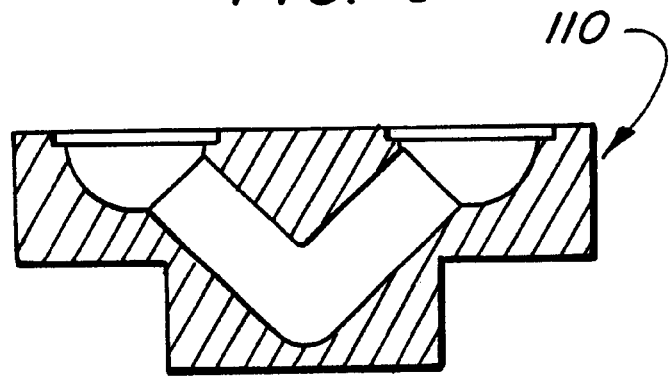
FIG. 9 is a cross sectional view of one of the manifold interconnect blocks of the third embodiment.
Figure 10:
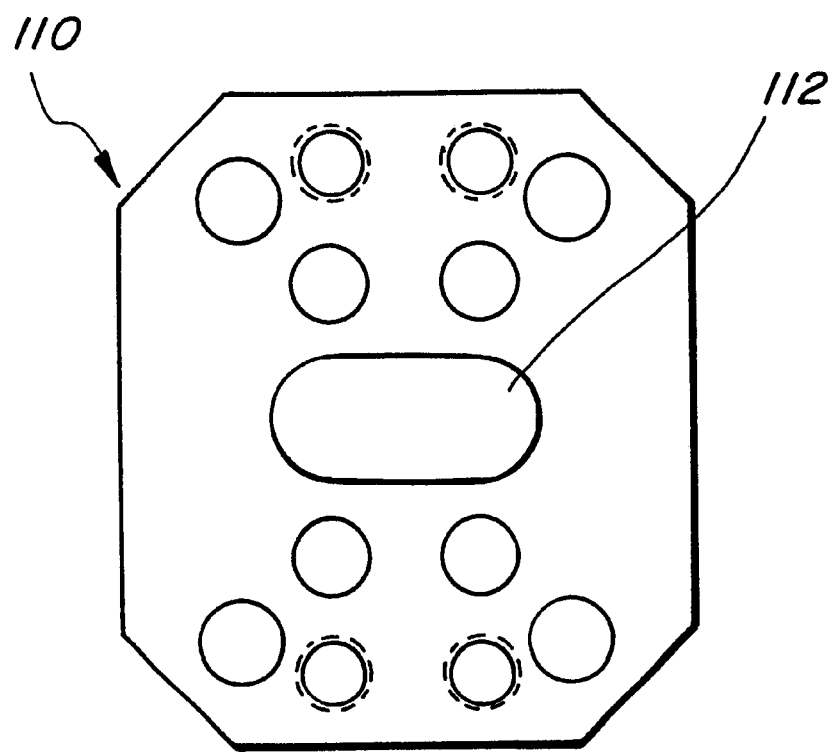
FIG. 10 is a bottom plan view of the embodiment of FIG. 9.

A third embodiment of the present invention is disclosed in FIGS. 8, 9 and 10. FIG. 9 discloses a cross-sectional view of a manifold block 110. A plan view of the bottom side of the manifold block 110 is shown in FIG. 10 wherein a central rib member 112 accommodates the V-gas passageway. The connector plates 114 are appropriately notched 116 at each side of the connector plate 114 to thereby accommodate the rib projection 112. As shown in the exploded view of the gas stick in FIG. 8, a plurality of different manifold blocks can be used in this system starting with the L-shaped end manifold block 116, the subsequent adjacent manifold blocks 110, the T-shaped manifold block 118 and terminating with another end manifold block 116. Appropriate fastener bolts can be used to join the individual manifold blocks to the appropriate connector plates as previously described with appropriate keepers and seals.

As can be appreciated, each of the manifold blocks will have an entrance and exit port for accessing a common surface although the individual manifold blocks can be varied in shape. The means for removably interlocking a pair of adjacent manifold blocks to operatively permit the respective fluid passageways to be positioned for interconnection on a common surface can be provided by the connector plates 114 and the spacer connector plate 120.

Those skilled in the art will appreciate that various adaptations and modifications of the just-described preferred embodiments can be configured without departing from the scope and spirit of the invention. Therefore, it is to be understood that, within the scope of the appended claims, the invention may be practiced other than as specifically described herein.

What is claimed is:

1. A manifold system for enabling a distribution of fluids, comprising:

a plurality of individual manifold blocks, each manifold block having a fluid passageway with an entrance and exit port accessing a common surface, and means for removably interlocking a pair of adjacent manifold blocks to operatively permit their respective fluid passageways to be positioned for interconnection;

wherein each manifold block has an upper flange on one side and a lower flange on an opposite side to enable an interlocking of adjacent manifold blocks, and wherein one of the entrance and exit ports of at least one manifold block of the plurality of manifold blocks extends onto the upper flange of the at least one manifold block.

2. The manifold system of claim 1, further comprising an active component wherein the active component bridges two adjacent manifold blocks.

3. The manifold system of claim 2, wherein the active component is a valve assembly.

* * * * *